(12) United States Patent
Herard et al.

(10) Patent No.: US 11,502,029 B2
(45) Date of Patent: Nov. 15, 2022

(54) THIN SEMICONDUCTOR CHIP USING A DUMMY SIDEWALL LAYER

(71) Applicants: STMICROELECTRONICS PTE LTD, Singapore (SG); STMICROELECTRONICS (ROUSSET) SAS, Rousset (FR)

(72) Inventors: Laurent Herard, Singapore (SG); David Parker, Greasque (FR); David Gani, Singapore (SG)

(73) Assignees: STMICROELECTRONICS PTE LTD, Singapore (SG); STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 16/927,776

(22) Filed: Jul. 13, 2020

(65) Prior Publication Data
US 2021/0020555 A1    Jan. 21, 2021

Related U.S. Application Data

(60) Provisional application No. 62/876,530, filed on Jul. 19, 2019.

(51) Int. Cl.
*H01L 23/498* (2006.01)
*H01L 21/48* (2006.01)
*H01L 21/3065* (2006.01)

(52) U.S. Cl.
CPC .... *H01L 23/49816* (2013.01); *H01L 21/3065* (2013.01); *H01L 21/4853* (2013.01); *H01L 23/4985* (2013.01)

(58) Field of Classification Search
CPC ..... H01L 24/17; H01L 24/81; H01L 21/4853; H01L 21/3065; H01L 23/49816;
(Continued)

(56) References Cited

U.S. PATENT DOCUMENTS 6,747,331 B2 * 6/2004 Infantolino ....... H01L 23/49838
257/457
8,012,797 B2    9/2011 Shen et al.
(Continued)

FOREIGN PATENT DOCUMENTS

JP    2006-332282 A    12/2006

OTHER PUBLICATIONS

Gupta et al., "Ultra-thin chips for high-performance flexible electronics," *NPJ Flexible Electronics* 2:8, 2018, 17 pages.
(Continued)

*Primary Examiner* — Alonzo Chambliss
(74) *Attorney, Agent, or Firm* — Seed IP Law Group LLP

(57) ABSTRACT

The present disclosure provides devices and methods in which a semiconductor chip has a reduced size and thickness. The device is manufactured by utilizing a sacrificial or dummy silicon wafer. A recess is formed in the dummy silicon wafer where the semiconductor chip is mounted in the recess. The space between the dummy silicon wafer and the chip is filled with underfill material. The dummy silicon wafer and the backside of the chip are etched using any suitable etching process until the dummy silicon wafer is removed, and the thickness of the chip is reduced. With this process, the overall thickness of the semiconductor chip can be thinned down to less than 50 μm in some embodiments. The ultra-thin semiconductor chip can be incorporated in manufacturing flexible/rollable display panels, foldable mobile devices, wearable displays, or any other electrical or electronic devices.

19 Claims, 8 Drawing Sheets

(58) Field of Classification Search
CPC ............... H01L 23/4985; H01L 21/563; H01L 2924/181; H01L 24/14; H01L 24/13
See application file for complete search history.

(56) References Cited

U.S. PATENT DOCUMENTS

| | | | |
|---|---|---|---|
| 9,048,222 B2 | 6/2015 | Hung et al. | |
| 2002/0121689 A1* | 9/2002 | Honda | H01L 23/49822 257/700 |
| 2002/0195718 A1* | 12/2002 | Imasu | H01L 25/105 257/778 |
| 2005/0224967 A1* | 10/2005 | Brandenburg | H01L 23/293 257/E33.059 |
| 2006/0220230 A1* | 10/2006 | Tanaka | H01L 23/481 257/E21.511 |
| 2007/0184604 A1* | 8/2007 | Honda | H01L 23/562 438/206 |
| 2010/0289142 A1* | 11/2010 | Shim | H01L 21/563 257/738 |
| 2013/0147041 A1* | 6/2013 | Chan | H01L 25/105 257/738 |
| 2015/0077918 A1* | 3/2015 | Zhang | H01L 25/50 361/679.02 |
| 2016/0005698 A1* | 1/2016 | Kim | H01L 25/105 257/686 |
| 2016/0104656 A1* | 4/2016 | Luan | H01L 21/4853 257/738 |
| 2016/0172299 A1* | 6/2016 | Noveski | H01L 23/5226 257/737 |
| 2017/0018533 A1* | 1/2017 | Miki | H01L 23/3135 |

OTHER PUBLICATIONS

Zhang, "Fabrication and Assembly of Ultra Thin Flexible Active Printed Circuits," Dissertation, Auburn University, May 11, 2006, 96 pages.

* cited by examiner

THIN SEMICONDUCTOR CHIP USING A DUMMY SIDEWALL LAYER

BACKGROUND

Technical Field

The present disclosure relates to a method of manufacturing an integrated circuit (IC) chip having a reduced thickness and a device thereof suitable for being applied to electronic wearable and flexible devices.

Description of the Related Art

With the growing interest in flexible electronic devices and wearable electronic devices, the semiconductor manufacturing industry has struggled to find a manufacturing method to thin down the semiconductor devices or IC chips to an ultra-thin level. A current state of the art semiconductor manufacturing process generally produces an IC chip having a thickness greater than about 100 μm or thicker. However, due to inherent limitations in the current manufacturing process, further thinning the IC chip is unfeasible.

With limited capability to thin down the thickness of the IC chip, the semiconductor industry cannot expand its IC chip applications to various technology fields such as rollable displays, foldable mobile devices, wearable displays, flexible film displays, or the like beyond the conventional application fields.

Due to the limits of the conventional IC chip, the size and the thickness of the chip does not meet the industries' growing need for providing minimal sized IC chips.

BRIEF SUMMARY

The present disclosure is directed to manufacturing a semiconductor chip having a reduced size and thickness. Accordingly, a semiconductor chip and a method of manufacturing such semiconductor chip having an overall ultra-thin size are provided. By providing a semiconductor chip having a reduced thickness, such as less than 50 μm in some embodiments, the industry can find a breakthrough in implementing the aforementioned rollable display panels, foldable mobile devices (e.g., mobile handsets, laptops, tablet computers, or the like), wearable displays, etc.

In various embodiments, an electronic device incorporating one or more semiconductor chips of the present disclosure will have a reduced size, such as a reduced thickness.

In various embodiments, the present disclosure provides a method of manufacturing a semiconductor chip having a reduced thickness by employing a sacrificial (or dummy) wafer as sidewalls. The dummy wafer may be a silicon wafer, and is used as dummy sidewalls while an underfill material is filled into a space between semiconductor chip and the dummy wafer. The dummy wafer is then further ground together with the passive surface of the semiconductor chip (i.e., the surface where no active circuitry components are present) to be thinned down to a preferred thickness. This process of employing a dummy silicon wafer helps to significantly reduce the size of the semiconductor chip.

In at least one embodiment, the present disclosure provides a semiconductor device that includes a circuit board, a chip, a plurality of solder balls, and an underfill material. The chip is positioned on a surface of the circuit board, and the chip has a first side and a second side that is opposite the first side. The plurality of solder balls is electrically coupled to the circuit board and to the first side of the chip, and the solder balls are spaced apart from each other. The underfill material contacts the circuit board, the chip, and the solder balls, and the underfill material has a first surface opposite the surface of the circuit board and sidewalls that are transverse to the first surface.

In some embodiments, the second side of the chip and the first surface of the underfill material are substantially coplanar.

In some embodiments, the sidewalls and the first surface of the underfill material are perpendicular to each other.

In some embodiments, the sidewalls of the underfill material are substantially perpendicular to the surface of the circuit board, and the first surface of the underfill material is substantially parallel to the circuit board.

In some embodiments, the underfill material extends between the spaced apart solder balls and laterally surrounds the solder balls.

In some embodiments, the semiconductor device further includes a first contact pad on the surface of the circuit board. At least one of the plurality of solder balls are mounted on the first contact pad.

In some embodiments, the semiconductor device further includes a second contact pad on the first side of the chip. At least one of the plurality of solder balls are connected to the second contact pad and the chip.

In some embodiments, the circuit board is a flexible printed circuit board.

In some embodiments, a thickness of the chip between the first side and the second side is less than 50 μm.

In one or more embodiments, the present disclosure provides a method that includes: attaching a silicon wafer to a surface of a circuit board having a conductive pad; forming a recess that exposes the conductive pad and a first portion of the surface of the circuit board by removing a portion of the silicon wafer; positioning a chip at least partially in the recess, the chip having a first surface facing the circuit board; dispensing an underfill material in the recess, the underfill material substantially filling a space between the silicon wafer and the chip and between the chip and the surface of the circuit board in the recess; forming a second surface of the chip coplanar with the silicon wafer by removing portions of the chip opposite the first surface; and exposing a second portion of the surface of the circuit board by removing the silicon wafer.

BRIEF DESCRIPTION OF THE SEVERAL VIEWS OF THE DRAWINGS

For a better understanding of the embodiments, reference will now be made by way of example only to the accompanying drawings. In the drawings, identical reference numbers identify similar elements or acts. The sizes and relative positions of elements in the drawings are not necessarily drawn to scale. For example, the shapes of various elements and angles are not necessarily drawn to scale, and some of these elements may be enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with semiconductor chip or semiconductor chip packaging have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
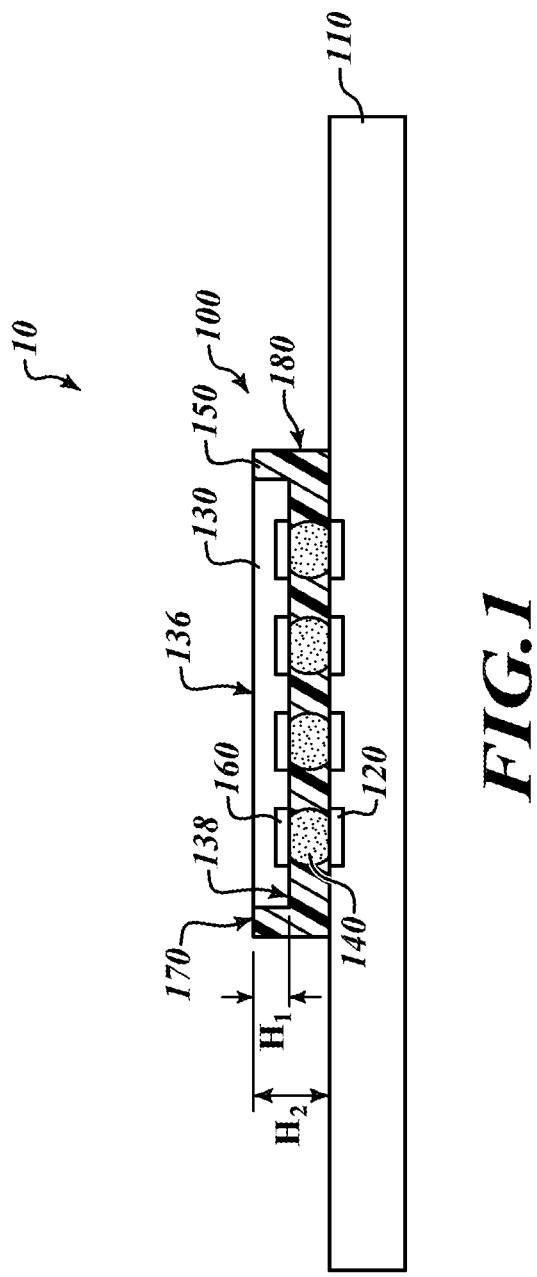
FIG. 1 is a cross-sectional view of an example embodiment of a semiconductor device according to the present disclosure.

FIG. 1 is a cross-sectional view of an example embodiment of a semiconductor device 10 according to the present disclosure. The semiconductor device 10 includes a circuit board 110 and a semiconductor structure 100 having a semiconductor chip 130 and an underfill material 150.

In this embodiment, the semiconductor structure 100 is mounted on a circuit board 110, which includes a semiconductor chip 130 having a variety of active and passive circuitry, such as transistors, resistors, capacitors, and logic, among other things, on or near a first surface 138 of the semiconductor chip 130. The semiconductor structure 100 further includes a plurality of first contact pads 160, solder balls 140, and an underfill material 150. However, other embodiments may include fewer or more elements of the semiconductor structure according to particular design requirements. The term semiconductor chip can also be used to refer to a semiconductor package in one or more embodiments.

The first contact pads 160 are located at the first surface 138 of the semiconductor chip 130. In one embodiment, an outer surface of the first contact pads 160 is coplanar with the first surface 138 of the semiconductor chip 130. However, in other embodiments, the first contact pads 160 can be non-coplanar with the first surface 138 of the semiconductor chip 130, for example, with portions of the first contact pads 160 extending outwardly beyond the first surface 138. In one or more embodiments, the first contact pads 160 are coplanar with the first surface 138 to reduce the height or thickness $H_1$ of the semiconductor chip 130 as well as thickness $H_2$ of the semiconductor structure 100.

The solder balls 140 are positioned between the semiconductor chip 130 and the circuit board 110 to provide an electrical contact. For example, the solder balls 140 may be melted to produce an electrical connection to attach the semiconductor chip 130 to the circuit board 110. For example, the chip 130 may be inverted so that the solder balls 140 are positioned between the first contact pads 160 on the chip 130 and second contact pads 120 on the underlying electronics or circuit board 110 and the solder is melted using, for example, a thermosonic bonding or reflow solder process or any other known methods. The space between the chip's circuitry and the circuit board 110 is filled with the underfill material 150. For example, the underfill material 150 may extend between the circuit board 110 and the first surface 138 of the semiconductor chip 130.

In one or more embodiments, the solder balls 140 connect to the circuit board 110 via second contact pads 120 located on the circuit board 110. The second contact pads 120 may be coplanar with the surface (e.g., the upper surface as shown) of the circuit board 110. In other embodiments, the second contact pads 120 can be arranged in a non-coplanar manner, for example, with the second contact pads 120 extending outwardly beyond the surface of the circuit board 110. The solder balls 140 form electrical paths which relay electrical signals to and from the first contact pads 160 of the semiconductor chip 130 and the second contact pads 120 of the circuit board 110. The solder balls 140 may be any suitable conductive structure capable of conducting electrical signals and may be, but is not limited to, a solder bump or a solder joint or the like.

The underfill material 150 is located adjacent to the semiconductor chip 130 and the solder balls 140. The underfill material 150 may be used to improve the structural integrity of the joints, for example the solder balls 140, and to provide stronger mechanical connection. In addition, the underfill material 150 may be used so the semiconductor structure 100 is reliable against vibration, shock, cracking or thermal changes, or the like, so that the semiconductor structure 100 holds up under the service life of the product. For example, the underfill material 150 distributes the thermal expansion mismatch between the semiconductor chip 130 and the circuit board 110, preventing stress concentration in the solder balls 140. It also provides a heat bridge, and reduces or eliminates stress to the solder balls 140 due to differential heating of the chip and the rest of a system (not shown) which the semiconductor structure 100 may be connected to or otherwise included as a part of.

In one embodiment, the underfill material 150 laterally surrounds a periphery of the semiconductor chip 130, and substantially fills the space between the plurality of solder balls 140. In one or more embodiments, the underfill material 150 may have a surface 170 (e.g., an upper surface as shown) and sidewalls 180, and the surface 170 and sidewalls 180 may be transverse to each other. In one embodiment, the sidewalls 180 of the underfill material 150 are substantially perpendicular or orthogonal to the surface of the circuit board 110. For example, the sidewalls 180 can have a precise vertical surface with respect to the circuit board 110 due to utilizing a dummy sidewall layer which will be explained in the following figures. The first surface 138 and a second surface 136 of the semiconductor chip 130 are opposite to each other and may be parallel to each other. In one embodiment, the second surface 136 of the semiconductor chip 130 is coplanar with the surface 170 of the underfill material 150. For example, the second surface 136 of the semiconductor chip 130 and the surface 170 of the underfill material 150 may be coplanar with each other due to an etching process that is applied at the same time to both surfaces. The underfill material 150 may be any suitable electrically-insulating material. For example, the electrically-insulating material can be an epoxy molding compound or the like.

The first contact pads 160 are at the first surface 138 of the semiconductor chip 130. As explained previously, in one embodiment, the first contact pads 160 may be overlaid on (or may extend outwardly from) regions of the semiconductor chip 130 and the first contact pads 160 do not necessarily have to have a coplanar surface with the first surface 138 of the semiconductor chip 130. However, in some embodiments, the first contact pads 160 may be embedded or recessed in the semiconductor chip 130 and may have a coplanar top surface with the semiconductor chip 130. Embedding the first contact pads 160 in the semiconductor chip 130 may involve etching the chip 130 and depositing the contact pads 160 on the etched portion of the chip 130. This contact will likely be part of the processing steps used to form the active and passive circuitry in the chip 130. Accordingly, in some embodiments, the first contact pads 160 can be deposited on the semiconductor chip 130 to a position lower than the first surface 138 of the semiconductor chip 130 which allows the overall thickness $H_2$ of the semiconductor structure 100 to have further reduced thickness. In one embodiment, the first contact pads 160 may be metal pads and may be made of a conductive material including, but not limited to, metals such as copper (Cu), aluminum (Al), nickel (Ni), chromium (Cr), titanium (Ti), or any combinations thereof. Similarly, the second contact pads 120 may be made of the same or similar conductive material as the first contact pads 160 and formed in substantially the same or similar manner as the first contact pads 160.

The circuit board 110 is electrically and physically connected to the second contact pads 120. In addition, although not shown, the circuit board 110 can be electrically and physically connected to other electronic components or other circuitries (not shown). In one embodiment, the circuit board 110 includes a flexible printed circuit board (PCB). A flexible PCB mounts electronic devices on flexible plastic substrates, such as polyimide, polyether ether ketone (PEEK) or transparent conductive polyester film or the like. However, based on other design needs and manufacturing processes, the type of flexible plastic substrates may vary accordingly and will not be limited to the examples set forth above. Examples of the flexible PCBs include single sided circuits, double sided circuits, multi-layer circuits, rigid-flex circuits, or the like.

The semiconductor chip 130 refers to any suitable semiconductor device manufactured using semiconductor material, such as silicon (Si). The term semiconductor chip 130 can be used interchangeably with an integrated circuit (IC) chip or microchip which all broadly indicates a set of electronic circuits having electronic components. In one embodiment, the semiconductor chip 130 may be electrically connected to the circuit board 110 using a flip chip process or any suitable process for interconnecting semiconductor devices, such as IC chips to external circuitry with solder balls 140. In one embodiment, the solder balls 140 are deposited on the chip 130 and in order to mount the chip 130 to external circuitry (e.g., a circuit board or another chip or wafer), it is flipped over so that its top side faces down, and aligned so that its contact pads 160 align with matching contact pads 120 on the external circuit, and then the solder is reflowed to complete the interconnect.

In one or more embodiments, the second surface 136 of the semiconductor chip 130 is a passive surface of the semiconductor chip. For example, the semiconductor chip 130 may be free of any active circuitry components at or near the second surface 136. This surface may be formed by etching the semiconductor chip 130 so that the semiconductor chip 130 has a thickness that is below 50 μm. On the other hand, the first surface 138 is an active surface of the semiconductor chip where the electronic circuitry components are formed.

By utilizing manufacturing processes according to the present disclosure, the thickness of $H_1$ of the semiconductor chip 130 may be less than 100 μm, and in some embodiments, the thickness $H_1$ may be less than 50 μm. For example, using a dummy silicon wafer wall, the thickness of $H_1$ of the semiconductor chip 130 can be thinned down to about 30 μm or less. The solder balls 140 may have a height between about 15 μm to 200 μm. Accordingly, the thickness of $H_2$ of the semiconductor structure 100 may range from about 45 μm to 250 μm. In one example, the semiconductor structure 100 may have a thickness as small as about 45 μm. Manufacturing processes according to the present disclosure of obtaining an ultra-thin semiconductor chip (less than 50 μm) will be explained in connection with FIGS. 2 to 8.

FIGS. 2 to 8 are cross-sectional views showing an example method of making an ultra-thin semiconductor chip according to an example embodiment of the present disclosure.

Figure 2:
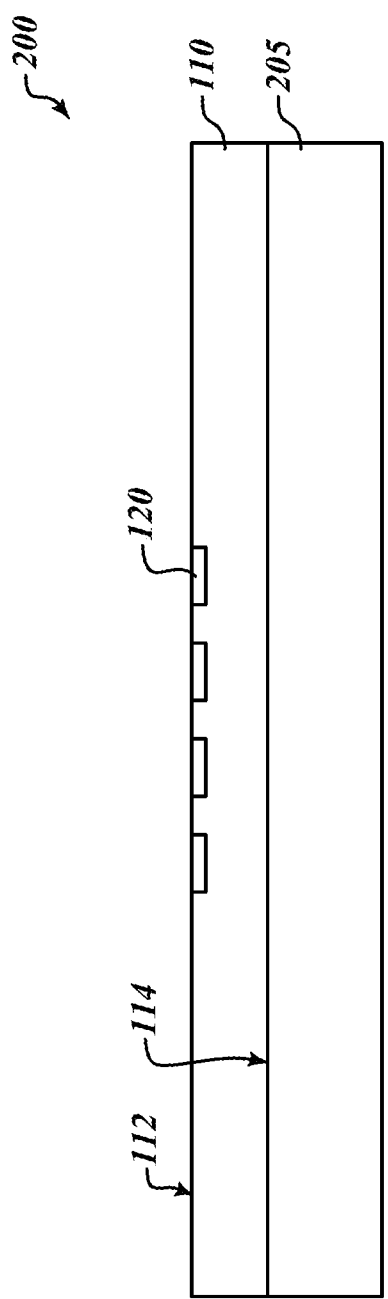
FIG. 2 is a cross-sectional view of a structure including a circuit board provided on a carrier, according to embodiments of the present disclosure.

FIG. 2 is a cross-sectional view of a structure 200 including a circuit board 110 provided on a carrier 205, according to embodiments of the present disclosure.

The carrier 205 provides support for the circuit board 110 for further processing. In one embodiment, the carrier 205 can be a wafer or a substrate, and may have an array form. The carrier 205 may be made of materials including, but not limited to, silicon (Si), gallium arsenide (GaAs), glass, or ceramic. In other embodiments, any suitable structure for providing support for the processing of the flexible printed circuit board can be used.

The circuit board 110 is provided on a surface 114 of the carrier 205. The surface 114 of the carrier 205 physically contacts the surface of the circuit board 110. The surface 114 of the carrier 205 and a surface 112 of the circuit board 110 are opposite to each other and may be parallel to each other. A plurality of second contact pads 120 is formed on the surface 112 of the circuit board 110 to be coplanar with the circuit board 110. For example, the second contact pads 120 may be embedded or recessed in the circuit board 110 and may have a coplanar top surface with the circuit board 110. Embedding the second contact pads 120 in the circuit board 110 may involve etching the board 110 and depositing the contact pads 120 on the etched portion of the board 110. In another embodiment, the second contact pads 120 may be overlain on regions of the circuit board 110 and do not necessarily have to have a coplanar surface with the surface 112 of the circuit board 110. In other embodiments, the second contact pads 120 can be deposited on the board 110 to a position lower than the surface 112 of the circuit board 110 which allows the overall thickness $H_2$ of the semiconductor structure 100 (FIG. 1) to be further reduced. The second contact pads 120, similar to the first contact pads 160, may be made of a conductive material including, but not limited to, metals such as Cu, Al, or the like.

In one embodiment, the circuit board 110 may be a flexible printed circuit board that is formed on the carrier 205 surface and the flexible printed circuit board may have a thickness ranging from about 70 µm to 150 µm. Other circuit boards 110 having different ranges of thickness may also be used. Further, various known methods in the art can be used to attach or mount the circuit board 110 to the carrier 205.

Figure 3:
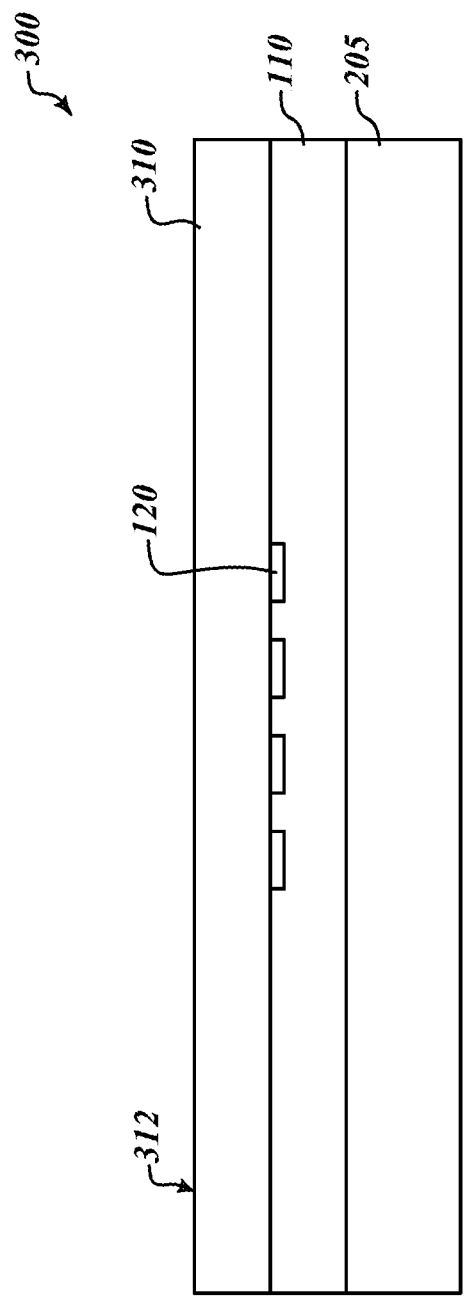
FIG. 3 is a cross-sectional view of a structure including a dummy layer provided on the circuit board, according to embodiments of the present disclosure.

FIG. 3 is a cross-sectional view of a structure 300 including a dummy layer 310 provided on the circuit board 110, according to embodiments of the present disclosure.

The dummy layer 310 is provided on the surface 112 of the circuit board 110. In one embodiment, the dummy layer 310 includes a silicon wafer. However, other suitable dummy layers may be used besides a silicon wafer to achieve an ultra-thin semiconductor chip. The dummy layer 310 may be attached or bonded to the circuit board 110 using any suitable method, such as any suitable method for silicon wafer bonding. However, other bonding methods known in the art can be used.

Once the dummy layer 310 is bonded to the circuit board 110, the top surface of the dummy layer 310 is ground. The grinding or the thinning of the silicon wafer is performed, for example, by a mechanical grinding process. For example, silicon can be removed by first coarse grinding followed by fine grinding. A grinding tool that contains diamond particles of specific dimensions can be used. The coarse grinding significantly reduces the thickness of the dummy layer 310 (e.g., a silicon wafer) which may cause micro-cracks and damages to the silicon lattice. Next, fine grinding completes the grinding process and removes any part of the silicon that may be damaged. However, other suitable grinding or thinning method known in the art may be used.

In one embodiment, the dummy layer 310 is ground to have a thickness about 45 µm to 250 µm. That is, the top of the dummy layer 310 is ground so that the thickness between the surface 112 of the circuit board 110 and the surface 312 of the dummy layer 310 has the above thickness. The surface 312 of the dummy layer 310 is opposite the surface 112 of the circuit board 110, and they may be parallel to each other. In some embodiments, the extent of grinding the dummy layer 310 to a certain thickness may be used to determine the overall thickness the semiconductor chip 130 would ultimately have. This will be explained in more detail in relation with FIG. 8.

Figure 4A:
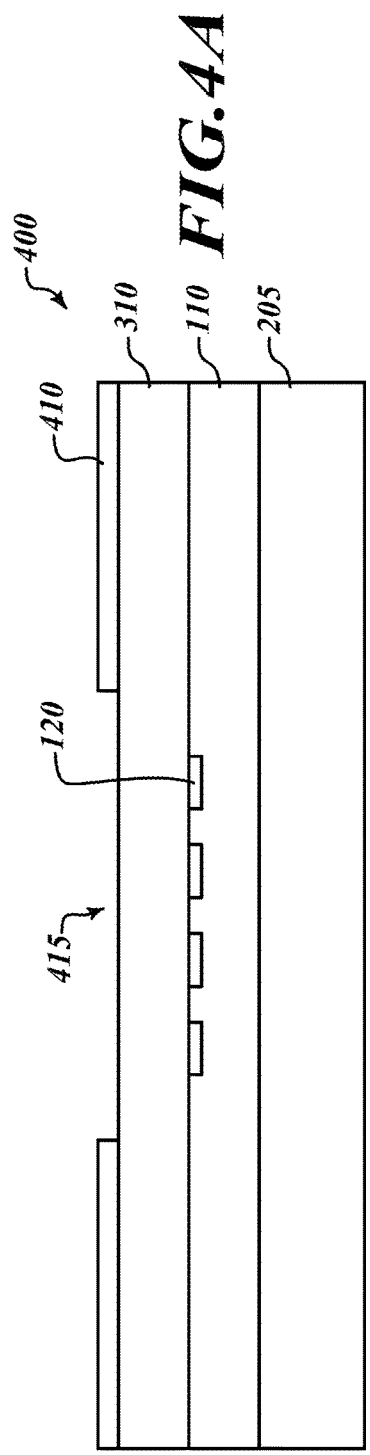
FIG. 4A is a cross-sectional view of a structure taken along the cut-line 4A-4A of FIG. 4B, showing a mask on a dummy layer according to one embodiment of the present disclosure.
Figure 4B:
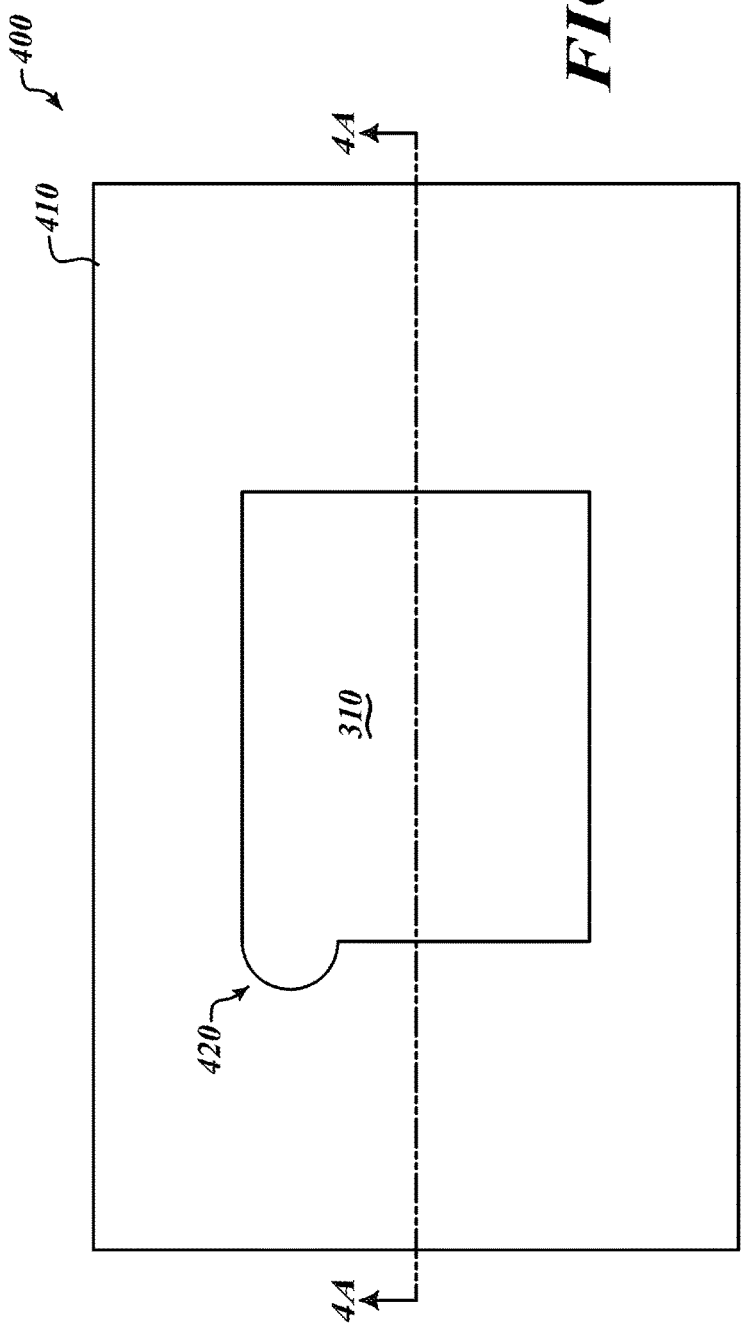
FIG. 4B is a top view of the structure having the mask on the dummy layer according to one embodiment of the present disclosure.

FIG. 4A is a cross-sectional view of a structure 400 taken along the cut-line 4A-4A of FIG. 4B, showing a mask 410 on a dummy layer 310 according to one embodiment of the present disclosure. FIG. 4B is a top view of the structure 400 having the mask 410 on the dummy layer 310 according to one embodiment of the present disclosure.

FIG. 4A illustrates the mask 410 overlaid on the dummy layer 310. The mask 410 is applied to the surface of the dummy layer 310 so that only the unmasked regions of the dummy layer 310 will be exposed. The unmasked region of the mask 410 can be referred to as an opening 415. The size of the opening 415 may be determined based on the size and dimension of the semiconductor chip 130 as shown in FIG. 1. More particularly, the opening 415 may be selected to have a size large enough so that the semiconductor chip 130 may fit into a recess that is later formed through the opening 415. The masked region using the mask 410 protects the dummy layer 310 from being etched using, for example, plasma dicing or wet etching. Any mask known in the art suitable for shielding the dummy layer 310 from being etched can be used.

In FIG. 4B, it can be seen that the mask 410 forms an additional opening 420 that is protruded from the opening 415. In some embodiments, the opening 415 may be substantially rectangular in shape, while the additional opening 420 may protrude outwardly from a periphery of the opening 415 in a semi-circular or other shape. It will be readily appreciated that the opening 415 and the additional opening 420 may be part of a same opening or aperture formed by the mask 410, with the additional opening 420 forming a protrusion of the opening 415 which protrudes outwardly at a region of the opening 420. This additional opening 420 provides a space for filling in the underfill material 150 as shown in FIG. 1, for example, by an injection process. The injection process of the underfill material 150 will be explained in detail in connection with FIGS. 7A and 7B. The additional opening 420 as shown is illustrated as a half-circle shape. However, in other embodiments, the additional opening 420 can have various different shapes and sizes. For example, the additional opening 420 can have a triangle shape, a rectangle shape, or any other shape. In various embodiments, the additional opening 420 may have any suitable dimension and shape for the underfill injection equipment to inject the underfill material 150 into the additional opening 420. In one embodiment, the additional opening 420 has a half-circle shape having a diameter within a range of about 150 µm to 400 µm.

The location of the additional opening 420 is adjacent to, and may protrude from, the opening 415 of the mask 410. The location as depicted is shown in the upper left corner of the opening 415 as seen from FIG. 4B. However, the additional opening 420 can be positioned at various locations suitable for filling the underfill material 150 between the dummy layer 310 and the semiconductor chip 130. In other embodiments, the additional opening 420 can be spaced apart from the opening 415 of the mask 410 if the underfill material 150 can be injected between the dummy layer 310 and the semiconductor chip 130.

Figure 5:
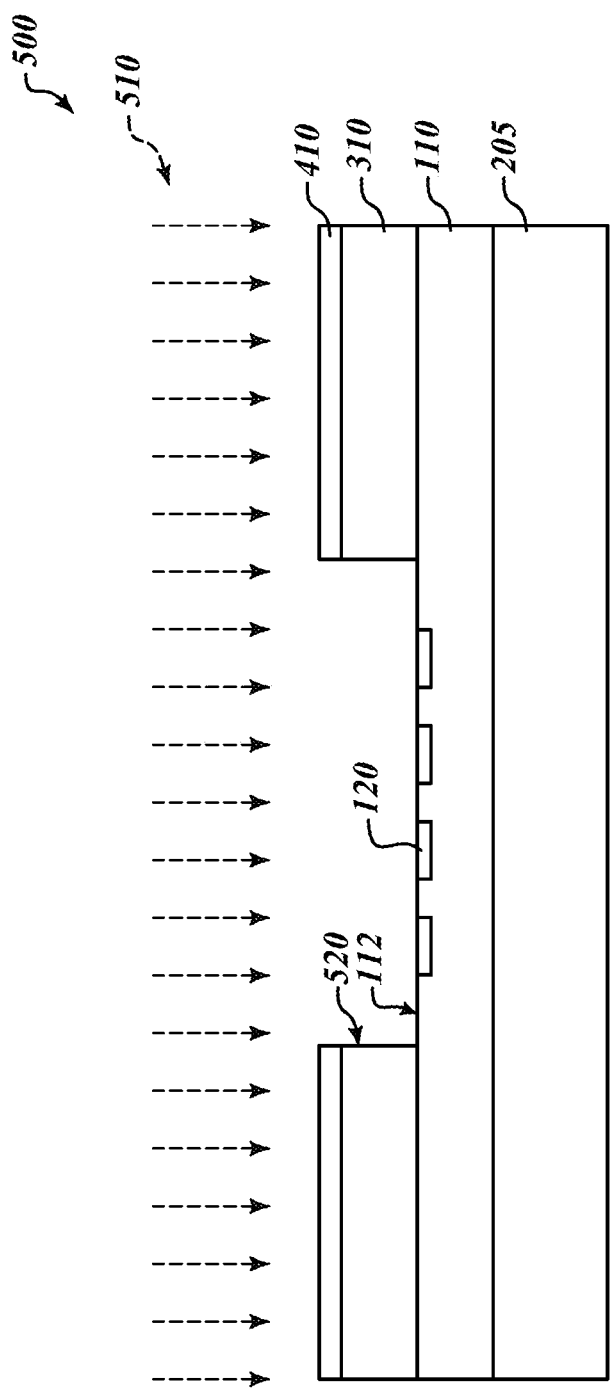
FIG. 5 is a cross-sectional view of a structure formed by etching a dummy layer according to one embodiment of the present disclosure.

FIG. 5 shows a cross-sectional view of a structure 500 formed by etching a dummy layer 310 according to one embodiment of the present disclosure.

An etching process 510 is employed to etch the exposed or unmasked region of the dummy layer 310. The unmasked region of the dummy layer 310 corresponds to the openings 415, 420 as shown in FIG. 4. The etching process 510 is applied until the surface 112 of the circuit board 110 and the second contact pads 120 are exposed. In various embodiments, the etching process 510 may include dry etching, wet etching, or plasma dicing. In etching, a liquid ("wet") or plasma ("dry") chemical agent removes the uppermost layer of the substrate (e.g., dummy layer 310) in the areas that are not protected by a mask 410 or a photoresist. This etching process removes the unmasked dummy layer 310 while at the same time forms a sidewall 520 using the dummy layer 310 not etched during the etching process 510. In one or more embodiments, the etching process 510 formulates a sidewall 520 of the dummy layer 310 that is flat and vertical to the surface 112 of the circuit board 110. For example, because the dummy layer 310, which is a silicon wafer in one embodiment, is etched through plasma dicing the sidewall 520, it may have a sharp orthogonal, vertical sidewall that is close to or substantially 90 degrees with respect to the surface 112 of the circuit board 110. In some embodiments, the sidewall 520 may be somewhat tapered as a result of the etching.

The leftover mask 410 is removed before proceeding with the next process. That is, after a mask 410 or a photoresist is no longer needed, it is removed from the dummy layer 310. In one embodiment, to remove the mask 410, a liquid resist stripper may be used. The liquid resist stripper chemically alters the resist so that it no longer adheres to the dummy layer 310. Other alternative known methods may be used to remove the mask 410. For example, the mask 410 may be removed by a plasma containing oxygen, or other suitable methods.

Figure 6:
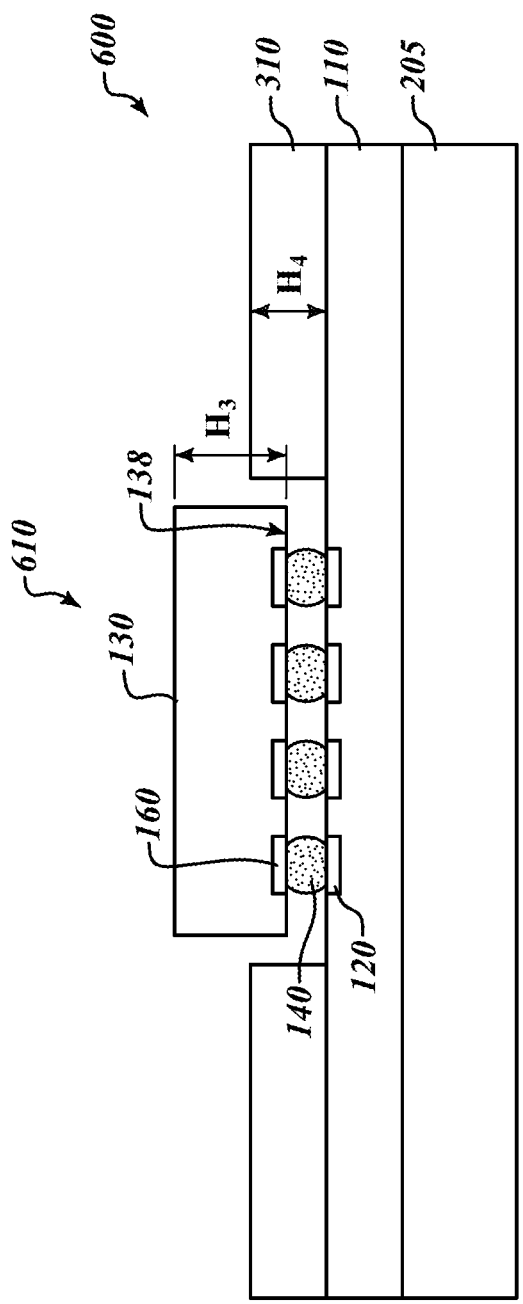
FIG. 6 is a cross-sectional view a structure including a semiconductor chip mounted on a circuit board according to embodiments of the present disclosure.

FIG. 6 is a cross-sectional view of a structure 600 including a semiconductor chip 130 mounted on a circuit board 110 according to embodiments of the present disclosure.

In FIG. 6, a semiconductor chip 130 is mounted on a recess portion 610 of the dummy layer 310. The recess portion 610 of the dummy layer 310 may be, for example, the portion of the dummy layer 310 that is removed by etching, as shown and described with respect to FIG. 5. The semiconductor chip 130 as shown here is different in thickness from the chip 130 as shown in FIG. 1. The thickness of the semiconductor chip 130 in FIG. 6 is indicated as $H_3$ which is greater than $H_1$. This thickness $H_3$ of the semiconductor chip 130 will be thinned down to thickness $H_1$ in FIG. 1. The dummy layer 310 has a thickness $H_4$ which in some embodiments is less than the thickness $H_3$ of the semiconductor chip 130.

In one embodiment, the semiconductor chip 130 is connected to the circuit board 110 using a flip chip process. In particular, the process may include creating integrated circuits on a wafer. In this process, the first contact pads 160 are metallized on the first surface 138 of the semiconductor chip 130. Then, a solder ball 140 is deposited on each of the first contact pads 160. The individual chips are cut and the semiconductor chips 130 are flipped and positioned so that the solder balls 140 are facing the second contact pads 120 of external circuitry, such as the circuit board 110. These solder balls 140 are later on melted using a hot air reflow process or the like to complete the interconnect.

Figure 7A:
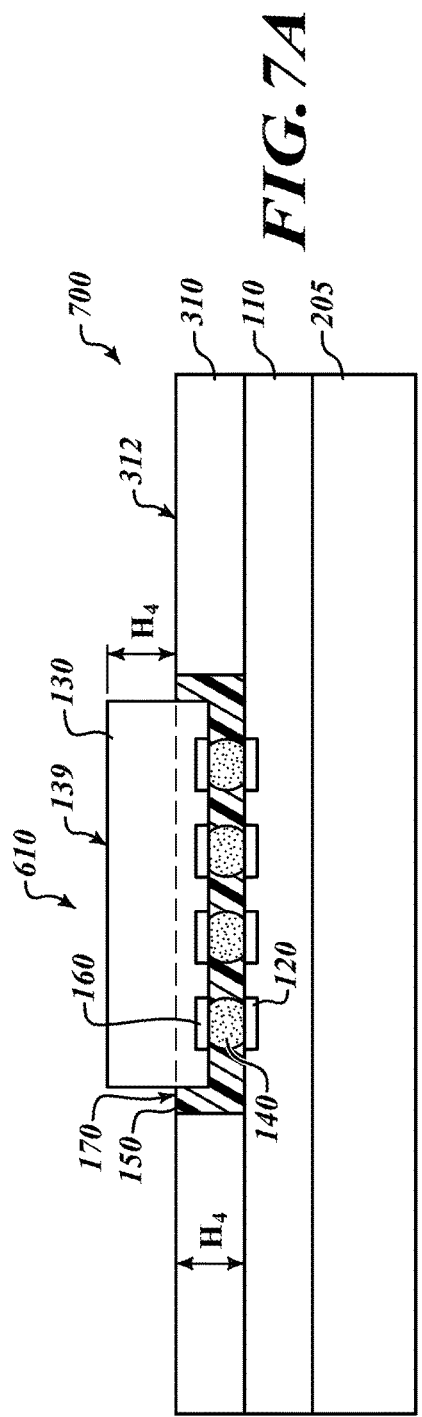
FIG. 7A is a cross-sectional view of a structure taken along the cut-line 7A-7A of FIG. 7B, showing an underfill material filled in between a semiconductor chip and a dummy layer according to one embodiment of the present disclosure.
Figure 7B:
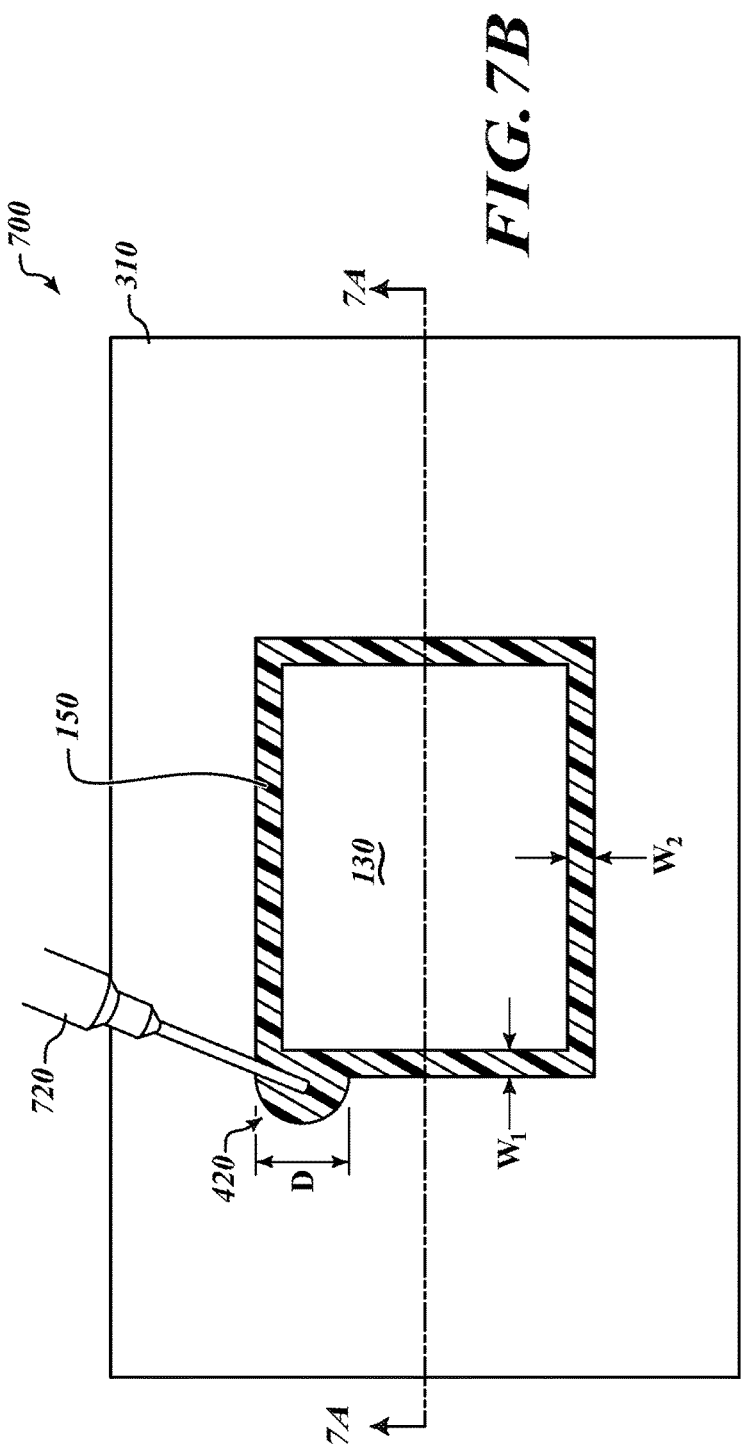
FIG. 7B is a top view of the structure with the underfill material in between a semiconductor chip and a dummy layer according to one embodiment of the present disclosure.

FIG. 7A is a cross-sectional view of a structure 700 taken along the cut-line 7A-7A of FIG. 7B, showing an underfill material filled in between a semiconductor chip and a dummy layer according to one embodiment of the present disclosure. FIG. 7B is a top view of the structure 700 with the underfill material in between a semiconductor chip and a dummy layer according to one embodiment of the present disclosure.

In FIG. 7A, the cross-sectional view shows that the underfill material 150 is filled in the space between the solder balls 140 and in the space between the semiconductor chip 130 and the dummy layer 310.

In one or more embodiments, the thickness of the dummy layer 310, $H_4$, and the thickness of the semiconductor chip 130 from the top surface 312 of the dummy layer 310 are the same. The dummy layer 310 and part of the semiconductor chip 130 are later etched using dry etching or wet etching methods. This process will be detailed in connection with FIG. 8.

FIG. 7B shows underfill injection equipment 720 that is used to inject the underfill material 150 in the above mentioned locations. The underfill injection equipment 720 uses the opening 420 to inject the underfill material 150. The opening 420 as shown is illustrated as a half-circle shape having a diameter D. In various embodiments, the opening 420 can have various different shapes and sizes as long as the dimensions of the opening 420 provides a suitable injection hole for injection the underfill material 150. For example, the diameter D of the half-circle shaped opening 420 may be within a range from about 150 μm to 400 μm. However, based on the type of underfill injection equipment 720 used and based on the dimensions of semiconductor chip 130, a smaller or a larger diameter D can be used.

In addition to the opening 420 for the underfill injection equipment 720, there is further space between the semiconductor chip 130 and the dummy layer 310 (e.g., sidewalls of the dummy layer 310) where the underfill material 150 will be filled. The space between the semiconductor chip 130 and the dummy layer 310 has a first width $W_1$ and a second width $W_2$. This part of the underfill material 150 will later on form the sidewalls of the semiconductor chip 130. In one embodiment, the first width $W_1$ and the second width $W_2$ may be about 50 μm. That is, the first width $W_1$ and the second width $W_2$ can have the same width. In other embodiments, the first width $W_1$ and the second width $W_2$ can have a width greater or smaller than about 50 μm. The width or space formed between the dummy layer 310 and the semiconductor chip 130 may vary based on different designs based on different dimensions.

In some embodiments, the first width $W_1$ and the second width $W_2$ can be different from each other. For example, the second width $W_2$ can be smaller than the first width $W_1$ because having a slightly greater width for the first width $W_1$ provides the underfill injection equipment 720 more space to inject the underfill material 150. However, in other embodiments, the second width $W_2$ can have a greater width than the first width $W_1$.

Figure 8:
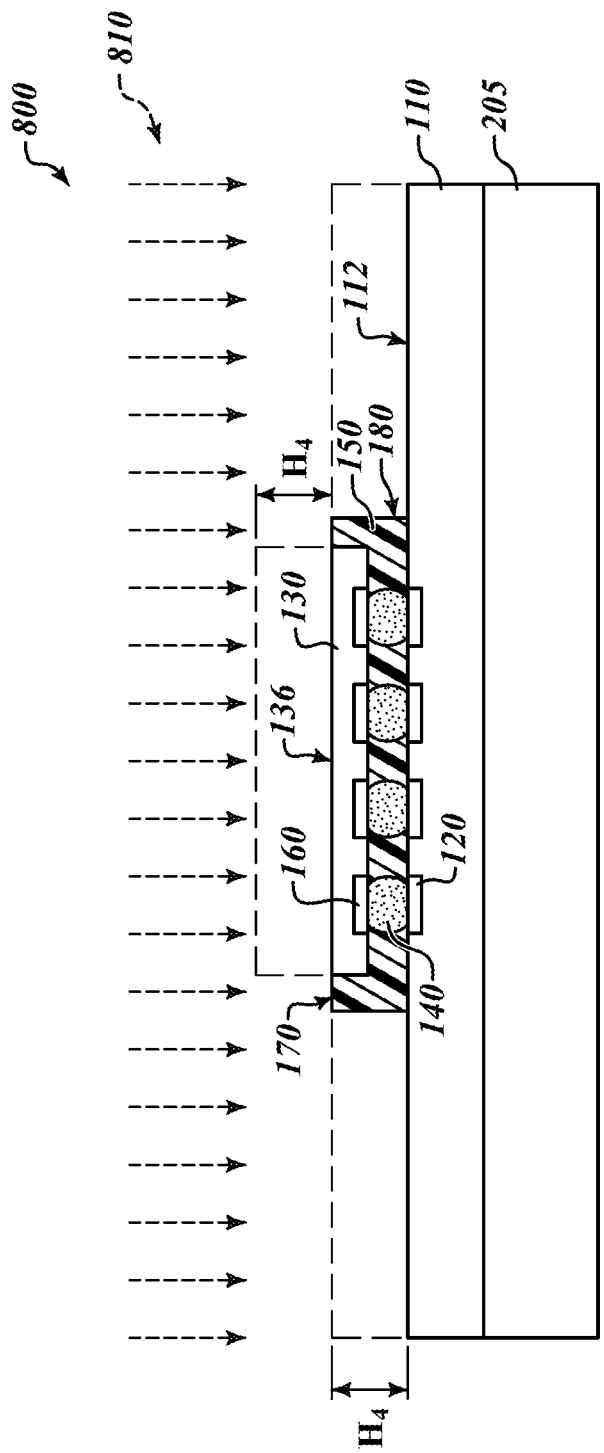
FIG. 8 is a cross-sectional view of a structure in which etching is performed on a dummy layer and a portion of a semiconductor chip according to one embodiment of the present disclosure.

FIG. 8 is a cross-sectional view of a structure 800 in which etching is performed on a dummy layer and a portion of a semiconductor chip 130 according to one embodiment of the present disclosure.

An etching process 810 is employed to etch off the dummy layer 310 adjacent to the semiconductor chip 130 as well as a portion of the semiconductor chip 130. In some embodiments, portions of the underfill material 150 may be etched together with the dummy layer 310 and the portion of the semiconductor chip 130, and in other embodiments, the underfill material 150 may be resistant to the etchant so that the underfill material 150 has a substantially same geometry after the etching process is completed as it does before the etching process. The etching process 810 used here may be similar or substantially the same as that used in the etching process 510 shown in FIG. 5. In various embodiments, the etching process 810 may include dry etching or wet etching. One example of dry etching that can be used is plasma dicing. This etching process removes the dummy layer 310 and exposes the surface 112 of the circuit board 110 and the portion of the semiconductor chip 130. For example, the plasma dicing process may etch the dummy layer 310 and the semiconductor chip 130 (each of which may be formed of silicon, for example) at a substantially same or similar rate. As a result, when the plasma dicing process is applied, the thickness $H_4$ of the dummy layer 310 may be completely removed by the etching, thereby exposing the surface 112 of the circuit board 110, and the etching may remove a same thickness $H_4$ from the semiconductor chip 130. This process results in a semiconductor chip 130 having a thickness of $H_1$, which is the thickness of the semiconductor chip 130 after the etching. As explained with respect to FIG. 6, the original thickness of the semiconductor chip 130 was $H_3$. However, by etching the silicon (e.g., the silicon dummy layer 310 and the silicon chip 130) at an equal rate using the etching process 810, the original thickness $H_3$ of the semiconductor chip 130 is reduced to $H_1$ by etching off a thickness equal to $H_4$ (for example, $H_3-H_4=H_1$). Accordingly, in some embodiments, the thickness of the semiconductor chip 130 is based on the thickness of the dummy layer 310.

In one or more embodiments, the plasma dicing leaves flat vertical edges with traces at the edge or the sidewall surface 180 of the underfill material 150. This creates a transverse relationship between the sidewalls 180 and the surface 112 of the circuit board 110. For example, because the dummy layer 310, which is a silicon wafer in one embodiment, is etched through plasma dicing the sidewalls 180 may have a sharp orthogonal sidewall that is close to or substantially 90 degrees with respect to the surface 112 of the circuit board 110.

After the etching process 810 that results in the removal of the dummy layer 310 and a portion of the semiconductor chip 130, a singulation of the semiconductor chip 130 including the circuit board 110 is performed. Although not shown, a person of ordinary skill in the art would readily appreciate that there may be a plurality of semiconductor chips in an array form mounted on a carrier 205. After the singulation of each semiconductor chip, each semiconductor chip 130 is removed from the carrier 205. The final product through the process from FIGS. 2 to 8 is shown in FIG. 1.

Based on the present disclosure, it is possible to manufacture compact-sized semiconductor chips with dimensions less than 50 µm. These ultra-thin semiconductor chips can save space and, thus, provide more room for integration by vertically or horizontally stacking the chips.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device, comprising:
a circuit board having a first surface;
a chip on the first surface of the circuit board, the chip having a first side and a second side that is opposite the first side, the chip having sidewalls between the first side and the second side;
a plurality of solder balls electrically coupled to the circuit board and the first side of the chip, the plurality of solder balls being spaced apart from each other; and
an underfill material that is in contact with the circuit board, the first side of the chip, the solder balls, and the sidewalls of the chip, exposed sidewalls of the underfill material being spaced from the sidewalls of the chip, the underfill material having a second surface that is coplanar with the second side of the chip, the underfill material extending directly between the sidewalls of the chip and the sidewalls of the underfill material, the sidewalls of the underfill material being substantially vertical;
an outer edge of the underfill material; and
lateral edges of the circuit board, the outer edge of the underfill material being internally positioned with respect to the lateral edges of the circuit board, the first surface of the circuit board is exposed between the sidewalls of the underfill material and the lateral edges of the circuit board;
a first contact in the circuit board, the first contact having a third surface that is coplanar with the first surface of the circuit board, a first one of the plurality of solder balls being coupled. to the first contact.

2. The semiconductor device of claim 1 wherein the sidewalls of the the underfill material and the second surface of the underfill material are perpendicular to each other.

3. The semiconductor device of claim 2 wherein the sidewalls of the underfill material are substantially perpendicular to the surface of the circuit board, and the second surface of the underfill material is substantially parallel to the circuit board.

4. The semiconductor device of claim 1 wherein the underfill material extends between the spaced apart solder balls and laterally surrounds the solder balls.

5. The semiconductor device of claim 1, further comprising:
a second contact on first the surface of the circuit board, the second contact having a fourth surface that is coplanar with the third surface of the first contact.

6. The semiconductor device of claim 5, further comprising:
a third contact on the first side of the chip, at least one of the plurality of solder balls being connected to the third contact of the chip and the second contact on the circuit board.

7. The semiconductor device of claim 1 wherein the circuit board is a flexible printed circuit board.

8. The semiconductor device of claim 1 wherein a thickness of the chip between the first side and the second side is less than 50 µm.

9. A method, comprising:
attaching a silicon wafer to a surface of a circuit board having a conductive pad;
forming a recess that exposes the conductive pad and a first portion of the surface of the circuit board by removing a portion of the silicon wafer;
positioning a chip at least partially in the recess, the chip having a first surface facing the circuit board;
dispensing an underfill material in the recess, the underfill material substantially filling a space between the silicon wafer and the chip and between the chip and the surface of the circuit board in the recess;

forming a second surface of the chip by removing portions of the chip opposite the first surface; and exposing a second portion of the surface of the circuit board by removing the silicon wafer.

10. The method of claim 9, further comprising electrically connecting the chip to the conductive pad of the circuit board.

11. The method of claim 9 wherein the forming the second surface of the chip and the exposing a second portion of the surface of the circuit board are performed concurrently by etching the chip and the silicon wafer.

12. The method of claim 11 wherein the etching includes plasma dicing.

13. The method of claim 11 wherein the selected thickness of the chip is less than 50 μm.

14. The method of claim 9 wherein the first surface of the chip is an active surface of the chip.

15. The method of claim 9 wherein the space between the silicon wafer and the chip is less than 50 μm.

16. The method of claim 9 wherein the forming the recess includes:
depositing a mask on the silicon wafer;
forming a first opening in the mask, the first opening substantially corresponding to an area where the circuit board is to be exposed;
forming a second opening in the mask for injecting the underfill material, the second opening being adjacent to the first opening; and
removing the portion of the silicon wafer by etching the portion of the silicon wafer exposed by the first and second openings.

17. The method of claim 16 wherein the second opening has a semicircle shape and a diameter of the semicircle is less than 400 μm.

18. A method, comprising:
providing a dummy layer on a circuit board having a plurality of conductive pads, the dummy layer having a first thickness;
forming a recess that exposes the plurality of conductive pads by removing a portion of the dummy layer;
positioning a chip in the recess, the chip having a second thickness that is greater than the first thickness; and
removing the dummy layer and portions of the chip by etching the chip and the dummy layer, the chip having a third thickness that is less than the second thickness after the etching.

19. The method of claim 18 wherein the chip has a thickness of less than 50 μm after the etching.

\* \* \* \* \*